United States Patent
Sanson

(10) Patent No.: US 9,520,844 B2
(45) Date of Patent: Dec. 13, 2016

(54) ELECTROMAGNETIC RADIATION DETECTION CIRCUIT FOR PULSE DETECTION INCLUDING AN AMPLIFYING TRANSISTOR AND A COUPLING CAPACITOR

(71) Applicant: SOCIETE FRANCAISE DE DETECTEURS INFRAROUGES-SOFRADIR, Chatenay Malabry (FR)

(72) Inventor: Eric Sanson, Grenoble (FR)

(73) Assignee: SOCIÉTÉ FRANÇAISE DE DÉTECTEURS INFRAROUGES-SOFRADIR, Palaiseau (FR)

( * ) Notice: Subject to any disclaimer, the term of this patent is extended or adjusted under 35 U.S.C. 154(b) by 132 days.

(21) Appl. No.: 14/362,761

(22) PCT Filed: Dec. 10, 2012

(86) PCT No.: PCT/FR2012/000511
§ 371 (c)(1),
(2) Date: Jun. 4, 2014

(87) PCT Pub. No.: WO2013/083889
PCT Pub. Date: Jun. 13, 2013

(65) Prior Publication Data
US 2014/0339399 A1    Nov. 20, 2014

(30) Foreign Application Priority Data

Dec. 8, 2011    (FR) .................................... 11 03765

(51) Int. Cl.
*H03F 3/08* (2006.01)
*G01J 5/00* (2006.01)
(Continued)

(52) U.S. Cl.
CPC ................. *H03F 3/087* (2013.01); *G01J 1/46* (2013.01); *H01L 27/1443* (2013.01); *H04N 5/33* (2013.01); *G01S 3/784* (2013.01)

(58) Field of Classification Search
CPC .......................... G01J 1/42; G01J 2001/4238; G01J 2001/442; G01J 2001/448; H01L 27/1443; H01L 27/14; H01L 27/14609; H01L 27/14669; H01L 31/02005; H01L 27/14649; G01S 3/784; H04N 5/33; H03F 3/087
(Continued)

(56) References Cited

U.S. PATENT DOCUMENTS 3,614,441 A * 10/1971 Boenke ...................... G01J 5/28
250/338.1
3,891,936 A * 6/1975 Romeo .................... H03F 3/185
257/300
(Continued)

FOREIGN PATENT DOCUMENTS

| EP | 0 083 411 A2 | 7/1983 |
| EP | 0 691 742 A2 | 1/1996 |
| FR | 2 753 796 A1 | 3/1998 |

OTHER PUBLICATIONS

Pain et al., "A Review of Infrared Readout Electronics for Space Science Sensors," *SPIE Proceedings*, The International Society for Optical Engineering—SPIE, Bellingham, Washington, USA, Jun. 15, 1993, vol. 2020, pp. 1-47.

*Primary Examiner* — Que T Le
*Assistant Examiner* — Jennifer Bennett
(74) *Attorney, Agent, or Firm* — Oliff PLC

(57) ABSTRACT

An electromagnetic radiation detection circuit includes a photodetector transforming the received electromagnetic radiation into an electric current. A bias circuit is connected to the photodetector. An amplifying circuit has an input terminal coupled to the photodetector. An amplifying tran-
(Continued)

sistor has a first low-impedance electrode forming the input terminal of the amplifying circuit and a second low-impedance electrode coupled to an output terminal of the detection circuit. The transistor is configured to conduct the current applied on the first electrode. A high-impedance electric load is connected to the second electrode to deliver a voltage representative of the electric current originating from the photodetector.

19 Claims, 4 Drawing Sheets

(51) Int. Cl.
*H04N 5/33* (2006.01)
*H01L 27/144* (2006.01)
*G01J 1/46* (2006.01)
*G01S 3/784* (2006.01)

(58) Field of Classification Search
USPC .......... 250/214 R, 338.1, 214 A, 206, 208.1, 250/214.1; 257/431, 443, 446, 451, 290, 257/291, 292, 257, 258
See application file for complete search history.

(56) References Cited

U.S. PATENT DOCUMENTS

| | | | |
|---|---|---|---|
| 3,904,888 A * | 9/1975 | Griffin | H03K 5/023 326/121 |
| 5,856,708 A * | 1/1999 | Wollesen | G11C 11/412 257/536 |
| 6,023,058 A | 2/2000 | Merle et al. | |
| 7,019,562 B1 * | 3/2006 | Ferris | H03K 19/09432 327/436 |
| 2003/0205663 A1 | 11/2003 | Boubal et al. | |
| 2010/0213352 A1 | 8/2010 | Veeder | |

* cited by examiner

ELECTROMAGNETIC RADIATION DETECTION CIRCUIT FOR PULSE DETECTION INCLUDING AN AMPLIFYING TRANSISTOR AND A COUPLING CAPACITOR

BACKGROUND OF THE INVENTION

The invention relates to an electromagnetic radiation detection device.

STATE OF THE ART

Electromagnetic radiation detection devices may be used to observe a slowly-varying scene or for pulse detection, that is, to detect a high-power signal for a short period.

The management of a very intense light signal for a very short period imposes many technical constraints on the detection circuit. Conventionally, the management of a high current flow for a very short time in the detection circuit imposes having a significant bandwidth so that the pulse power is not time-diluted, which would make it difficult to detect. A significant bandwidth representative of a high execution speed is generally obtained with a device having a significant electric power consumption.

There also is a constraint relative to the sensitivity of the device to the observed radiation in order to avoid for the pulse not to be detected. Although the signal has a very high power, it only exists for a very short time, and it thus should be ascertained that the device is capable of detecting the pulse.

Different embodiments have been described in prior art to detect a pulsed signal. In document FR 2753796 illustrated in FIG. 1, a photodiode 1 receives the electromagnetic radiation to be analyzed. The cathode of photo-diode 1 is connected to a first resistor 2 and to the two input terminals of an amplifier 3. A second resistor 4 is connected between the output terminal and one of the input terminals of amplifier 3 to form a differentiating electric circuit 5. A third resistor is connected between the cathode of the photodiode and one of the input terminals of amplifier 3.

Such an architecture is difficult to integrate, particularly for stand-alone devices since the bias current of such a device should be high in order to obtain a high execution speed.

In document US 2003/0205663, illustrated in FIG. 2, photodiode 1 is biased between its substrate and a power supply voltage Vd by means of two field-effect transistors T1 and T2 which form a bias circuit 6. The cathode of photodiode 1 connected to bias circuit 6 is also connected to the gate electrode of an amplifying transistor T3. The light signal received by photodiode 1 is applied to the gate electrode of bias transistor T3, which amplifies this signal to send it from the drain electrode of amplifying transistor T3 to output terminal 7. Output terminal 7 is connected to bias circuit 6.

As in the previous embodiment, bias transistor T3 should be submitted to a significant biasing to be able to manage the amount of power delivered by photodiode 1 with a high execution speed, which raises an electric power consumption issue. The document is vaguer as to the follower circuit. Such a follower circuit should be slow, but no specific information is provided to explain how to obtain the desired slow speed. Since the bias current is defined by photodiode 1, there may be a problem of stability of the feedback loop. Thus, such a teaching does not enable to viably form a pulse detector.

SUMMARY OF THE INVENTION

As can be observed, there is a need to provide a detection device which is capable of detecting pulse signals with a decreased electric power consumption.

This need tends to be fulfilled by means of a device which comprises:
  a photodetector transforming the received electromagnetic radiation into an electric current,
  a bias circuit connected to the terminals of the photodetector,
  an amplifying circuit different from the bias circuit and comprising an amplifying transistor formed by a field-effect transistor or a bipolar transistor having a first source or emitter electrode forming an input terminal of the amplifying circuit coupled to a terminal of the photodetector and a second drain or collector electrode coupled to an output terminal of the detection circuit, the amplifying circuit being configured so that the amplifying transistor be traversed by the current applied to the first source or emitter electrode and so as to provide this current on the output terminal with a higher impedance than on the first source or emitter electrode,
  a voltage source connected to the control electrode of the amplifying transistor,
  a passive electric load connected to the second drain or collector electrode of the amplifying transistor.

BRIEF DESCRIPTION OF THE DRAWINGS

The foregoing and other features and advantages of the present invention will more clearly appear from the following non-limiting description of specific embodiments of the invention, shown in the accompanying drawings, among which.

DESCRIPTION OF SPECIFIC EMBODIMENTS OF THE INVENTION

Figure 1:
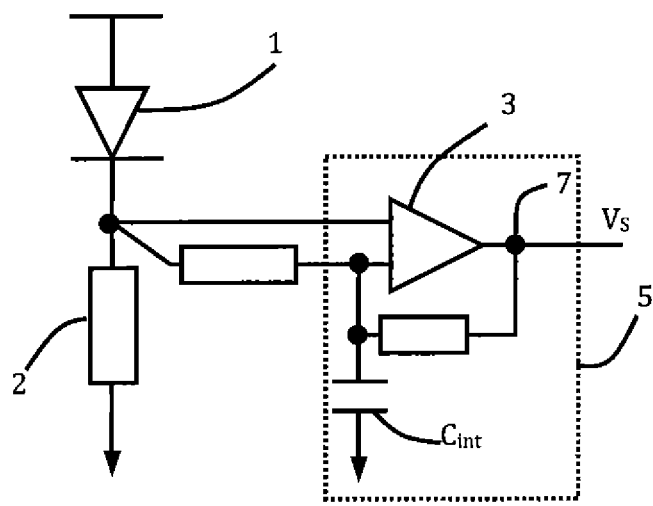
FIG. 1 schematically shows a first detection circuit according to prior art.
Figure 2:
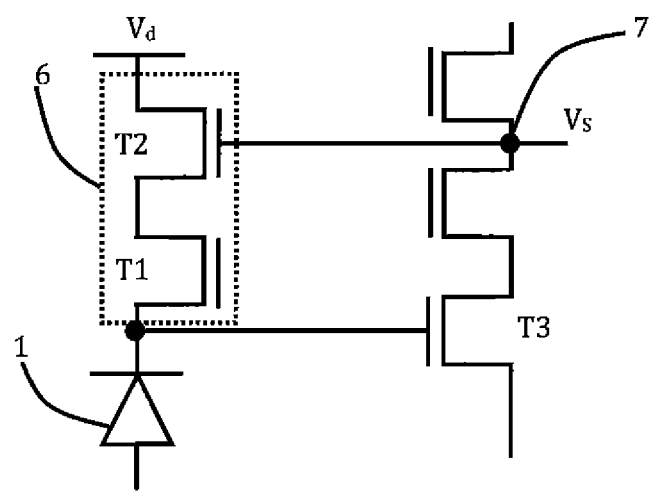
FIG. 2 schematically shows a second detection circuit according to prior art.
Figure 3:
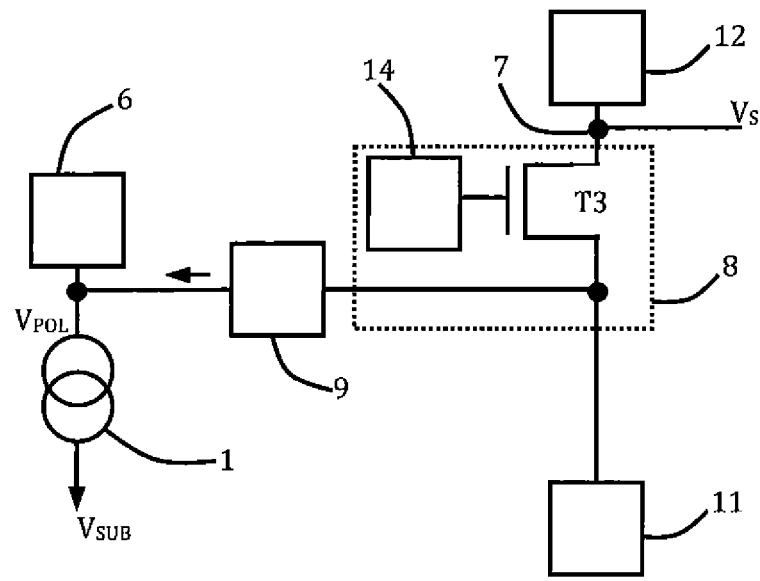
FIG. 3 schematically shows a detection circuit according to the invention.

As illustrated in FIG. 3, the detection device comprises a photodetector 1 schematized as a current source, capable of converting the received light signal into an electric signal. Photodetector 1 is configured to detect an electromagnetic radiation in a specific wavelength range.

Photodetector 1 may be formed by any adapted device, for example, by a photodiode or by a quantum well or multi-quantum well device. The photo-detector is advantageously configured to detect an infrared radiation, preferably, a specific range of infrared radiation, for example, the LWIR, MWIR, or SWIR ranges.

The detection device also comprises a circuit 6 for biasing photodetector 1. Bias circuit 6 is configured so that photodetector 1 behaves as a current source for which the intensity of the current depends on the received electromagnetic radiation.

Bias circuit 6 imposes a first potential difference across photodetector 1. The bias circuit is advantageously connected across photodetector 1. A first potential, for example, a substrate potential $V_{SUB}$, is applied to a first terminal of photodetector 1. A second potential, for example, a bias potential $V_{POL}$, is applied to the second terminal of photodetector 1.

Bias circuit 6 may be active or passive. Passive circuit means a circuit performing no amplification. Such a circuit is formed by passive elements, for example, diodes, resistors, capacitors. Active circuit means a circuit capable of performing the amplification, across photodetector 1, of the biasing delivered by a voltage source. An active circuit provides a better regulation of the bias point applied to the photodetector. Such a circuit comprises at least one transistor enabling to modulate the applied voltage and it requires a higher electric power consumption than with a passive circuit.

Bias circuit 6 is configured to bias photodetector 1 to its desired operating mode. Since bias circuit 6 is coupled to photodetector 1, it is configured to avoid completely absorbing the emitted pulsed electric signal. Bias circuit 6 and an amplifying circuit 8 are connected or coupled to photodetector 1 to define two different flow paths for the current emitted by photodetector 1.

Bias circuit 6 and amplifying circuit 8 are configured so that the pulse portion of the signal emitted by photodetector 1 mainly reaches amplifying circuit 8 and thus only slightly crosses bias circuit 6 and so that the static portion of the emitted signal mainly reaches bias circuit 6 and thus only slightly crosses amplifying circuit 8.

In such a configuration, the pulsed electric signal emitted by photodetector 1 is representative of the received light pulse and this pulsed electric signal mainly flows through amplifying circuit 8.

To perform its biasing function, the terminal of bias circuit 6 connected to photodetector 1 has a first impedance value which is low in the low-frequency range and advantageously in the current range envisaged for photodetector 1. This terminal further preferably has a higher impedance value in the high-frequency range to prevent the loss of the current pulse signals in the bias circuit and in order to promote the current flow inside of amplifying circuit 8.

Advantageously, the input terminal of amplifying circuit 8 has a low impedance in the high-frequency range and advantageously strong currents. It also has a higher impedance in the range of low frequencies and advantageously of low currents In the low-frequency range, the input impedance of amplifying circuit 8 is greater than the input impedance of bias circuit 6. In the high frequency range, the input impedance of amplifying circuit 8 is lower than the input impedance of bias circuit 6.

The passing from the low-frequency range to the high-frequency range is performed around 1 MHz, typically for a value in the 0.5-10 MHz range according to the targeted type of application.

One of the terminals of photodetector 1, here, the second terminal, is also coupled to amplifying circuit 8. Amplifying circuit 8 receives, on an input terminal, the electric signal or part of the intensity of the electric signal emitted by photodetector 1. Amplifying circuit 8 generates on its output terminal a signal representative of the information received on the input terminal, that is, a signal representative of the information emitted by photodetector 1. The output signal of circuit 8 is amplified with respect to the signal present at the input of circuit 8. The output terminal of amplifying circuit 8 forms output terminal 7 of the detection device.

In a specific embodiment which may be combined with the foregoing, output terminal 7 of amplifying circuit 8 has a higher impedance than its input terminal in order to convert the current signal originating from the input terminal into a voltage signal on output terminal 7. The input terminal of circuit 8 is embodied by the first electrode of transistor T3. In such a configuration, it is advantageous to maintain the current transiting between the input terminal and the output terminal of circuit 8 to simply obtain the desired gain.

Amplifying circuit 8 is biased by a second potential difference imposed by first and second terminals of an additional bias circuit.

The input of amplifying circuit 8 is formed by an amplifying transistor T3. Amplifying transistor T3 may be a field-effect transistor having its source electrode or first electrode receiving the signal originating from photodetector 1. The drain electrode, or second electrode, is coupled to output terminal 7 of the detection device. The current flowing through amplifying transistor T3 is a function and is representative of the signal emitted by photodetector 1. Amplifying transistor T3 may also be made in bipolar technology. In this case, the emitter (first electrode) receives the signal from photodetector 1 and the collector (second electrode) is coupled to output terminal 7. Generally, the amplifying circuit also called amplifier 8 comprises an amplifying transistor T3 having a low-impedance electrode coupled to photodetector 1. Amplifying transistor T3 is traversed by the signal or part of the signal emitted by photodetector 1. Advantageously, amplifying transistor T3 is connected to the photodetector to keep a compact circuit and a high execution speed. The second electrode of the transistor is coupled to output terminal 7. Amplifying circuit 8 is configured so that the first electrode of transistor T3 receives, preferably, more than 50% of the current emitted by the photodetector. Amplifying circuit 8 is also configured so that the current received by transistor T3 reaches the first electrode and is transferred to the second electrode and output terminal 7. Since the first electrode has a lower impedance than the second electrode, there is a voltage gain.

In this embodiment, the signal emitted by photodetector 1 or a representative signal is applied to a low-impedance terminal, which improves the response time of the detection device. The source or emitter electrode of a transistor has a much lower impedance than the impedance of the gate or base electrode of this same transistor.

Further, the signal originating from photodetector 1 generates an additional current through amplifying transistor T3, which enables, in certain embodiments, to increase the bias current during the useful period, that is, during the light pulse duration. Outside of the pulse duration, the bias current is decreased, which enables to limit the electric power consumption of the device.

In such a configuration, the detection device may have a low bias current in the idle state. When the photodetector receives a light pulse, the current pulse emitted by photodetector 1 causes the flowing of a higher current in amplifying transistor T3, which modifies the bias conditions of amplifier 8. The current emitted as a response to the light pulse acts as an additional bias current, which enables, in the case of an advantageously additional configuration, to increase the bandwidth of amplifier 8 at the very particular moment of the pulse occurrence. It is then possible to decrease the bias current of amplifier 8 during the waiting for the pulse and thus to decrease the general power consumption of the circuit. Although the circuit resembles a device mounted in direct injection mode, the operation is different. While in a direct injection circuit, the aim is to integrate electric charges, this circuit has the function of amplifying the signal emitted by photodetector 1. To integrate these charges, the value of the electric capacitance of the capacitor is adapted to the need and it is placed at the circuit output. However, in this embodiment, the capacitor has a lower electric capacitance to improve the response time. Preferably, the value of this capacitance is decreased as much as possible to have a very low response time.

In an advantageous embodiment, because of its compactness, output terminal 7 is formed by the drain electrode or the collector of amplifying transistor T3.

Advantageously, amplifying transistor T3 is configured with bias circuit 6 and photodetector 1 so that the current flowing through amplifying transistor T3 is directed in the same direction as the current taking part in the biasing of photodetector 1. in such conditions, the impedance value of the source electrode of transistor T3 decreases, which increases the responsiveness and thus the bandwidth of the amplifying transistor.

Due to this impedance decrease, the current injection in amplifying transistor T3 is improved.

The second terminal of photodetector 1 is coupled to amplifying circuit 8 via a coupling circuit 9 which enables to have the signal emitted by photodetector 1 or part of this signal pass onto the input terminal of amplifying circuit 8.

Figure 4:
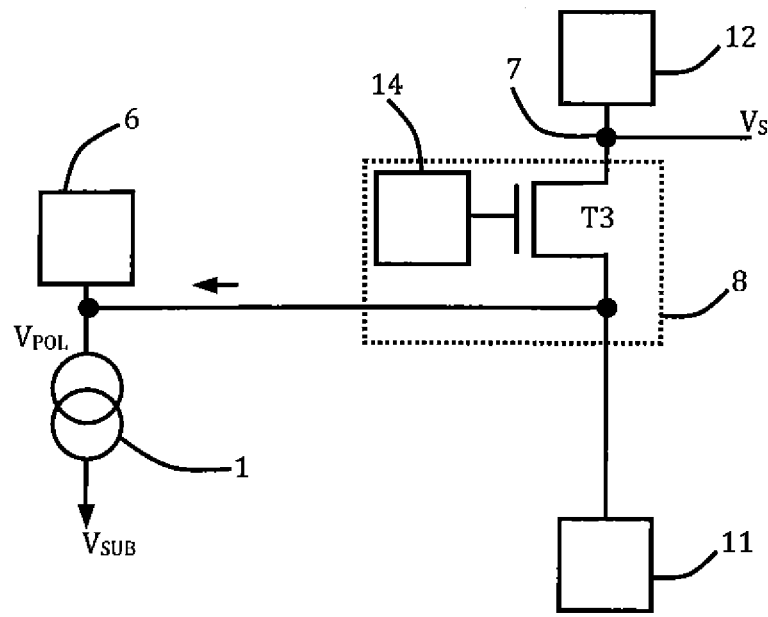
FIG. 4 schematically shows a specific detection circuit according to the invention, FIG. 5 schematically shows another specific detection circuit according to the invention, FIGS. 6 and 7 schematically show two still more specific embodiments of a detection circuit according to FIG. 5.

In a specific embodiment illustrated in FIG. 4 and which may be combined with the previous embodiments, coupling circuit 9 is formed by a conductive line which directly connects the second terminal of photodetector 1 to the input terminal of amplifying circuit 8. In such a configuration, amplifying circuit 8 directly receives the signal emitted by photodetector 1. Only a small portion of the signal is lost in bias circuit 6 according to the performance thereof.

Figure 5:
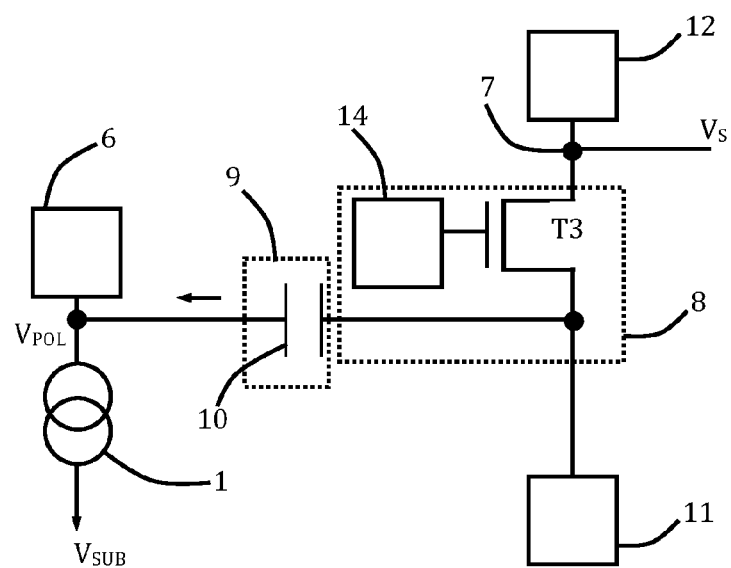

In another alternative embodiment illustrated in FIG. 5 and which may be combined with the previous embodiments (except that of FIG. 4), coupling circuit 9 comprises a coupling capacitor 10 which is connected between photodetector 1 and amplifying circuit 8. Coupling capacitor 10 blocks the passing of part of the signal emitted by photodetector 1. Coupling capacitor 10 is arranged to block the D.C. component and the slow variations of the light signal emitted by photodetector 1 to only let through the fast variable component, that is, the current pulse.

Advantageously, coupling circuit 9 is formed by coupling capacitor 10, which has a first terminal connected to photodetector 1 and to bias circuit 6 and a second terminal connected to the source (or emitter) electrode of amplifying transistor T3.

In a preferred embodiment capable of being combined with the previous embodiments, the additional bias circuit comprises a first passive electric load 11 arranged between amplifying transistor T3 and the first terminal of the additional bias circuit. First passive electric load 11 enables to drain off the quiescent current of transistor T3. The first passive electric load also enables to block the pulse current to direct it towards amplifying transistor T3.

In a preferred embodiment, first passive electric load 11 is configured to avoid drifting or to limit the drift of the current representative of the light pulse. Such a specific architecture enables the device to be more rapidly repositioned in a configuration where the next pulse is awaited, and thus to decrease the power consumption of the final device. In a still more specific embodiment illustrated in FIGS. 6 and 7, first passive electric load 11 has the electric characteristic of a diode. First passive electric load 11 may be formed, for example, by a diode or a transistor arranged to operate as a diode, for example, by connecting together the gate and drain electrodes.

First passive electric load is coupled to the source (or emitter) electrode of transistor T3.

In another embodiment which may be combined with the previous embodiments, the circuit comprises a second passive electric load 12 coupled to the drain (or collector) electrode of amplifying transistor T3. The second passive electric load 12 is arranged between amplifying transistor T3 and the second terminal of the additional bias circuit. Second passive electric load 12 enables to offset the voltage with respect to the associated bias line and to determine the output impedance value which sets the amplifier gain.

The association of passive electric load 12 with the amplifying circuit enables to convert the current signal applied to the input terminal of the amplifying circuit into a voltage signal on output terminal 7.

In a preferred embodiment, second passive electric load 12 is configured to have a high impedance and a low electric capacitance. Second passive electric load 12 is then used to set a voltage gain of amplifying transistor T3 for the pulse signal.

In a specific embodiment, second passive electric load 12 behaves as a current source which is advantageously saturated in the absence of a light pulse. The current set point value of this current source, that is, the intensity of the current delivered in the absence of a pulse substantially corresponds to the value representative of the signal to be detected and delivered by photodetector 1. The current source is connected to the second electrode of transistor T3.

Second passive electric load 12 is connected to output terminal 7.

The intensity of the current flowing through amplifying transistor T3 in the idle state, that is, in the absence of a pulse, is set by the potential applied to the control electrode of the amplifying transistor (here, the gate electrode or the base) and by the impedance value of first passive electric load 11.

The biasing applied to the control electrode of transistor T3 originates from a voltage source 14.

Figure 6:
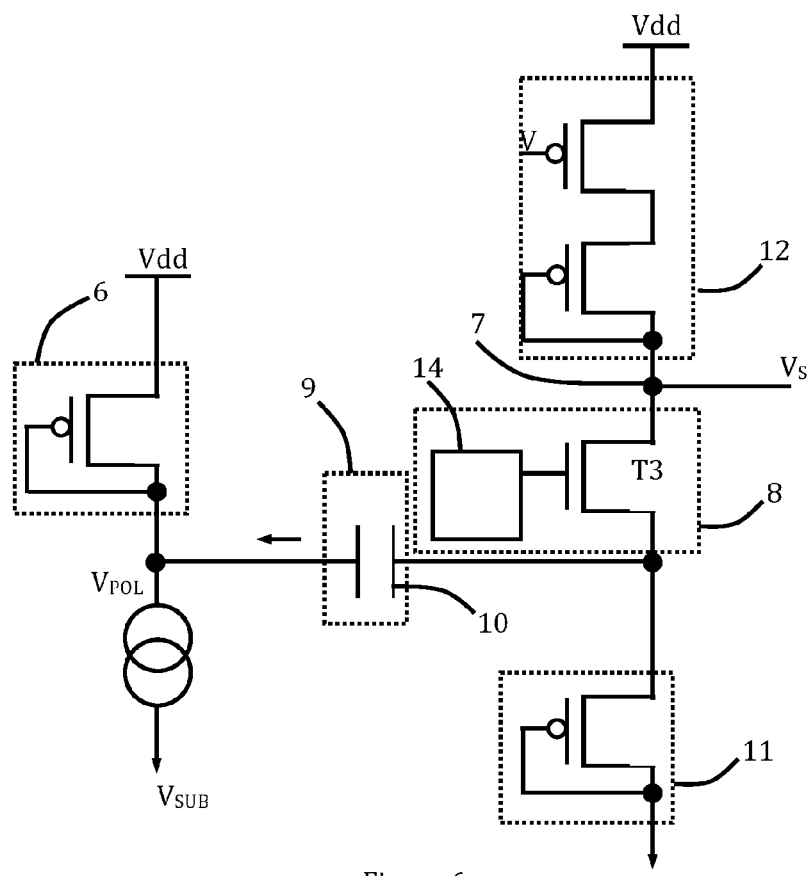
Figure 7:
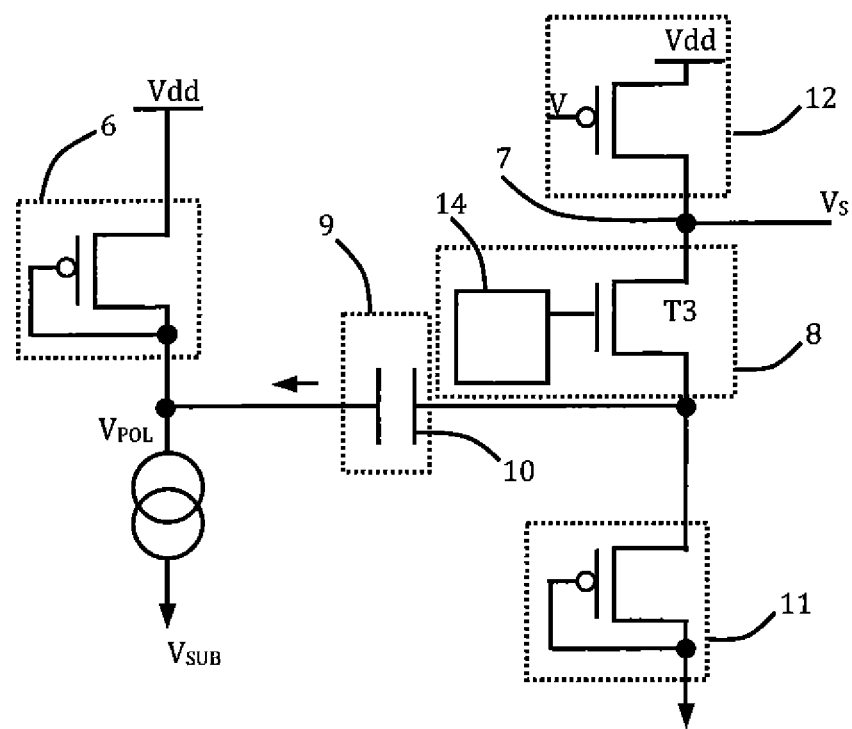

The embodiments illustrated in FIGS. 6 and 7 are particularly advantageous since they are very compact.

The terminals of photodetector 1 are connected to the bias circuit to impose the first potential difference. Amplifying circuit 8 is formed by amplifying transistor T3. To gain more compactness, amplifying transistor T3 is a field-effect transistor. According to the embodiments, the source electrode is connected directly or by means of coupling capacitor 10 to the second terminal of photodetector 2.

First passive electric load 11 is connected to the source electrode and second passive electric load 12 is connected to the drain electrode. Output terminal 7 of the detection device is formed by the common connection between the drain electrode of amplifying transistor T3 and second passive electric load 12.

Advantageously, amplifying transistor T3 is of NMOS type and it is coupled to the cathode of photodetector 1. In an alternative embodiment, amplifying transistor T3 is of PMOS type and it is coupled to the anode of photodetector 1.

In a preferred embodiment illustrated in FIGS. 6 and 7, first passive electric load 11 comprises or is formed by an additional diode-connected transistor, for example, a diode-connected PMOS transistor. The diode-connected transistor is connected to the common terminal of the source electrode of amplifying transistor T3 and of photodetector 1 or coupling capacitor 10. In addition to the above-described advantages, this architecture is particularly compact and easy to form. The diode-connected transistor is connected between a bias line and the first electrode of amplifying circuit 8.

In another preferred embodiment capable of being combined with the former, second passive electric load 12 comprises or is formed by another additional transistor to form a current source, for example, a PMOS transistor behaving as a current source. The transistor is connected to the drain electrode of amplifying transistor T3 to define output terminal 7 of the detection device. The transistor is also connected to a bias line which delivers a first voltage, for example, voltage Vdd. In the embodiment illustrated in FIG. 6, the additional transistor of load 12 is configured to form a diode. In the embodiment of FIG. 7, the additional transistor of load 12 has a control electrode linked to a voltage source, which sets the maximum current delivered by the additional transistor. In such a configuration, load 12 forms a saturated current source. The nominal current of load 12 is representative of the current threshold that will be detected for a pulse.

Such an architecture enables to deliver a binary signal on output terminal 7. This signal is a function of the light pulse detected by photodetector 1.

Second passive electric load 12 may further comprise a circuit for offsetting the voltage levels, for example, by means of a diode, to define the amplitude of the output signal. The diode may be formed by a transistor. The diode is assembled between current source 12 and output terminal 7.

Bias circuit 6 of photodetector 1 advantageously comprises an additional diode-connected transistor connected to the second terminal of photo-detector 1, which provides a sufficient impedance over a wide bias range. Advantageously, the transistor is of PMOS type, opposite to that of the amplifying transistor (NMOS in FIG. 6) and it is connected to first voltage Vdd. This specific configuration is favorable for a better transfer of the current pulse to the amplifying transistor, which has carriers of improved mobility. The additional diode-connected transistor is connected between a bias line and the first terminal of photodetector 1.

Output terminal 7 of the detection device is intended to be connected to an analysis circuit (not shown), which memorizes the passing of the different pulses. In an alternative embodiment, the analysis circuit is integrated in the detection device. As an example, the input terminal of the analysis circuit is the input terminal of a flip-flop, for example, an RS flip-flop having an analog input.

As compared with the above-mentioned prior art documents, the detection device enables to substantially improve the sensitivity (approximately by a factor 10) while allowing a very low power consumption.

The detection device is particularly advantageous when it comprises a photodetector array. Each photodetector is then associated with a bias circuit 6 and with an amplifying circuit 8.

Electric loads 11 and 12 are output loads which collect the electric signal provided by output terminal 7. These output loads enable to use output terminal 7 to output a voltage signal. Loads 11 and 12 have impedance values selected to deliver a voltage signal. Loads 11 and 12 may independently be linear or non-linear loads. Linear load means a load having a constant value of its impedance, whatever the value of the received current. Non-linear load means a load having its impedance value varying according to the bias current. Particularly advantageously, the impedance value of load 11 increases when the bias current increases.

The invention claimed is:

1. An electromagnetic radiation detection circuit comprising:
   a photodetector configured to transform the received electromagnetic radiation into an electric current:
   a bias circuit connected to terminals of the photodetector, the bias circuit receiving a first part of a current emitted by the photodetector;
   an amplifying circuit, which is different from the bias circuit, and comprising an amplifying transistor formed by a field-effect transistor or a bipolar transistor,
   the field-effect transistor or the bipolar transistor having a first electrode forming an input terminal of the amplifying circuit coupled to a first terminal of the photodetector so as to receive a second part of the electric current emitted by the photodetector, the first electrode being a source electrode or an emitter electrode,
   the field-effect transistor or the bipolar transistor having a second electrode coupled to an output terminal of the electromagnetic radiation detection circuit, the second electrode being a drain electrode or a collector electrode, and
   the amplifying circuit being configured so that the electric current applied to the first electrode flows through the amplifying transistor and so as to provide this electric current on the output terminal with an impedance higher than an impedance on the first electrode;
   a voltage source connected to a control electrode of the amplifying transistor; and
   a passive electric load connected to the second electrode of the amplifying transistor, wherein
   a first terminal of a coupling capacitor is directly connected to the first terminal of the photodetector and to the bias circuit, and
   a second terminal of the coupling capacitor is directly connected to the first electrode of the amplifying transistor.

2. The circuit according to claim 1, wherein the passive electric load is a diode.

3. The circuit according to claim 1, comprising a current source configured to be in a saturated state in an idle state, said current source being connected to the second electrode of the amplifying transistor.

4. The circuit according to claim 2, wherein the diode is assembled between a current source and the output terminal.

5. The circuit according to claim 2, wherein the bias circuit comprises an additional diode-connected transistor connected between a bias line and the first terminal of the photodetector.

6. The circuit according to claim 1, wherein a passive load comprising an additional diode-connected transistor is connected between a bias line and the first electrode of the amplifying circuit, and is configured to form a saturated current source.

7. The circuit according to claim 1, wherein the voltage source connected to the control electrode of the amplifying transistor is configured to define an intensity of a current flowing through the amplifying transistor in an idle phase.

8. The circuit according to claim 1, wherein the passive load comprising an additional diode-connected transistor is connected between a bias line and the first electrode of the amplifying circuit and configured to define a threshold value of a current pulse detected by the amplifying circuit.

9. The circuit according to claim 1, wherein the passive load comprising an additional diode-connected transistor is connected between a bias line and the first electrode of the amplifying circuit and configured to deliver a binary signal to the output terminal.

10. The circuit according to claim 5, wherein the additional diode-connected transistor is a metal-oxide-semiconductor (MOS) transistor of a first type and the amplifying transistor is a MOS transistor of a second type opposite to the first type so as to increase transfer of a current pulse provided by the photodetector.

11. The circuit according to claim 1, wherein the bias circuit and the amplifying circuit are configured so that a pulsed portion of a signal emitted by the photodetector mainly reaches the amplifying circuit and a static portion of the signal emitted by the photodetector mainly reaches the bias circuit.

12. The circuit according to claim 1, wherein the bias circuit is configured to substantially not absorb a pulsed signal provided by the photodetector.

13. The circuit according to claim 1, wherein the amplifying circuit has a low impedance in a high-frequency range and a high impedance in a low-frequency range.

14. The circuit according to claim 1, wherein in a high frequency range, an input impedance of amplifying circuit is lower than an input impedance of the bias circuit.

15. The circuit according to claim 1, wherein, the amplifying transistor, the bias circuit and the photodetector are configured so that a current flowing through amplifying transistor is directed in a same direction as a current from the bias circuit for the biasing of photodetector.

16. An electromagnetic radiation detection circuit comprising:
a photodetector configured to transform the received electromagnetic radiation into an electric current;
a bias circuit connected to terminals of the photodetector, the bias circuit receiving a first part of a current emitted by the photodetector;
an amplifying circuit, which is different from the bias circuit, and comprising an amplifying transistor formed by a field-effect transistor or a bipolar transistor,
the field-effect transistor or the bipolar transistor having a first electrode forming an input terminal of the amplifying circuit coupled to a first terminal of the photodetector so as to receive a second part of the electric current emitted by the photodetector, the first electrode being a source electrode or an emitter electrode,
the field-effect transistor or the bipolar transistor having a second electrode coupled to an output terminal of the electromagnetic radiation detection circuit, the second electrode being a drain electrode or a collector electrode, and
the amplifying circuit being configured so that the electric current applied to the first electrode flows through the amplifying transistor and so as to provide this electric current on the output terminal with an impedance higher than an impedance on the first electrode;
a voltage source connected to a control electrode of the amplifying transistor; and
a passive electric load connected to the second electrode of the amplifying transistor,
wherein the source terminal or the emitter terminal of the amplifying circuit is connected to a terminal of the photodetector by means of a coupling circuit configured to allow only a part of the signal emitted by the photodetector to pass through the coupling circuit.

17. The circuit according to claim 16, wherein the coupling circuit has a first terminal connected to an electric node common to the photodetector and to the bias circuit.

18. The circuit according to claim 17, wherein the coupling circuit has a second terminal connected to the first electrode of the amplifying transistor.

19. The circuit according to claim 18, wherein the coupling circuit includes a coupling capacitor having a first terminal connected to the electric node common to the photodetector and to the bias circuit and a second terminal connected to the first electrode of the amplifying transistor.

* * * * *